United States Patent
Collura et al.

(10) Patent No.: US 7,085,182 B2
(45) Date of Patent: Aug. 1, 2006

(54) FUSE BLOWING INTERFACE FOR A MEMORY CHIP

(75) Inventors: Michel Collura, Draguignan (FR); Jean-Patrice Coste, Antibes (FR); Yannis Jallamion-Grive, Mougins (FR)

(73) Assignee: Infineon Technologies AG, Munich (DE)

( * ) Notice: Subject to any disclaimer, the term of this patent is extended or adjusted under 35 U.S.C. 154(b) by 210 days.

(21) Appl. No.: 10/856,685

(22) Filed: May 28, 2004

(65) Prior Publication Data

US 2005/0018517 A1 Jan. 27, 2005

(30) Foreign Application Priority Data

May 28, 2003 (EP) .................................. 03291293

(51) Int. Cl.
*G11C 7/00* (2006.01)
(52) U.S. Cl. ............. 365/201; 365/200; 365/225.7
(58) Field of Classification Search ............. 365/201, 365/200, 225.7, 189.12
See application file for complete search history.

(56) References Cited

U.S. PATENT DOCUMENTS

| 4,546,454 | A | 10/1985 | Gupta et al. |
| 5,123,016 | A | 6/1992 | Muller et al. |
| 5,805,789 | A | 9/1998 | Huott et al. |
| 6,226,764 | B1 * | 5/2001 | Lee ............................ 714/718 |
| 6,295,237 | B1 | 9/2001 | Pochmuller |
| 6,496,429 | B1 * | 12/2002 | Murai et al. ................ 365/200 |
| 6,650,583 | B1 * | 11/2003 | Haraguchi et al. .......... 365/201 |
| 6,768,694 | B1 * | 7/2004 | Anand et al. ............ 365/225.7 |

FOREIGN PATENT DOCUMENTS

| EP | 0 528 744 A | 2/1993 |
| EP | 1 408 512 A1 | 4/2004 |
| EP | 1 408 513 A1 | 4/2004 |

* cited by examiner

*Primary Examiner*—Anh Phung
(74) *Attorney, Agent, or Firm*—Maginot, Moore & Beck

(57) ABSTRACT

A fuse blowing interface (7) for a memory chip (1) comprising a latch register for latching a calculated memory repair solution when a prefuse request signal is received from an external tester device (8); and a fuse blowing unit with electrical fuses which are blown according to the calculated memory repair solution when a blow request signal is received from the external tester device (8).

20 Claims, 14 Drawing Sheets

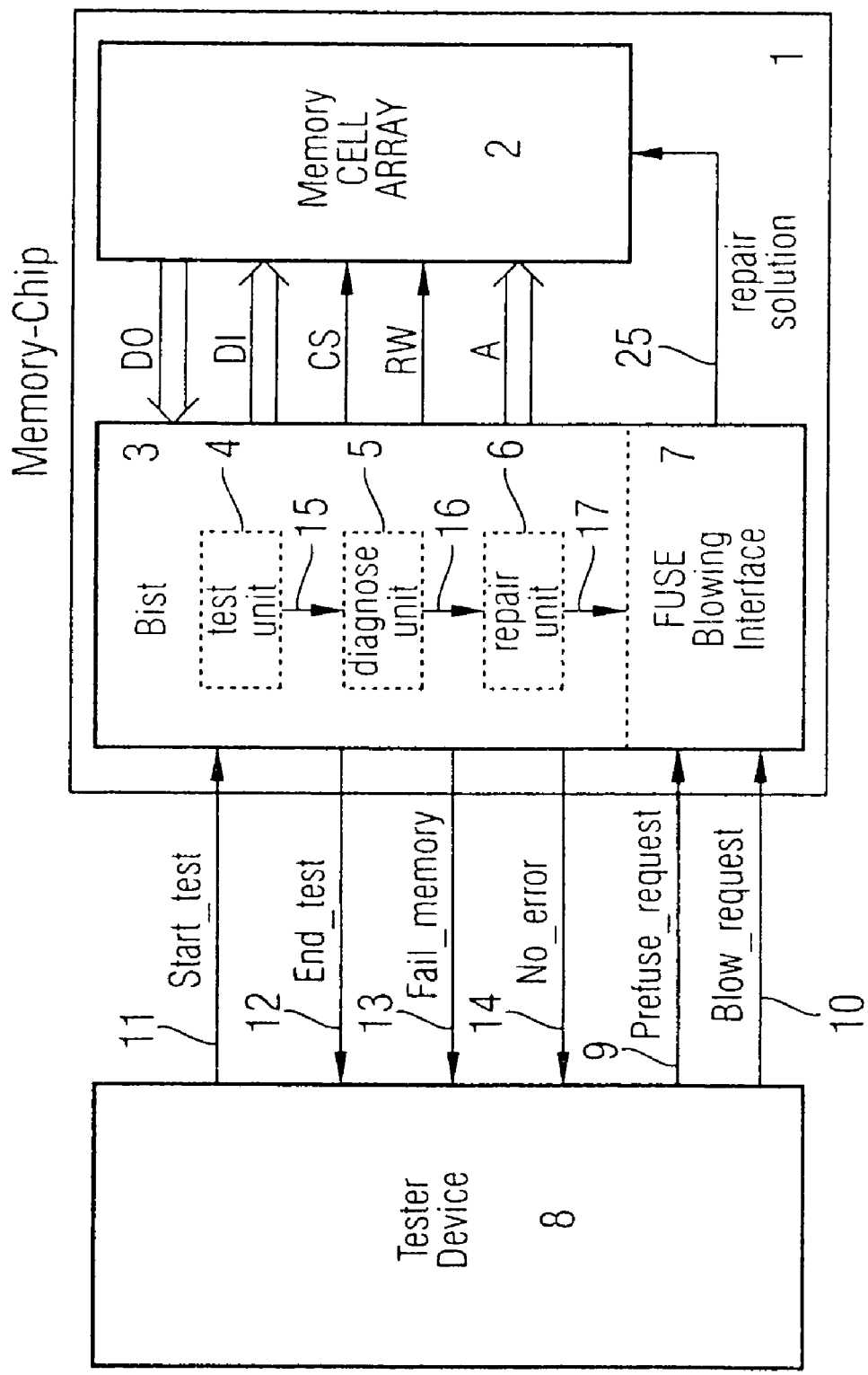

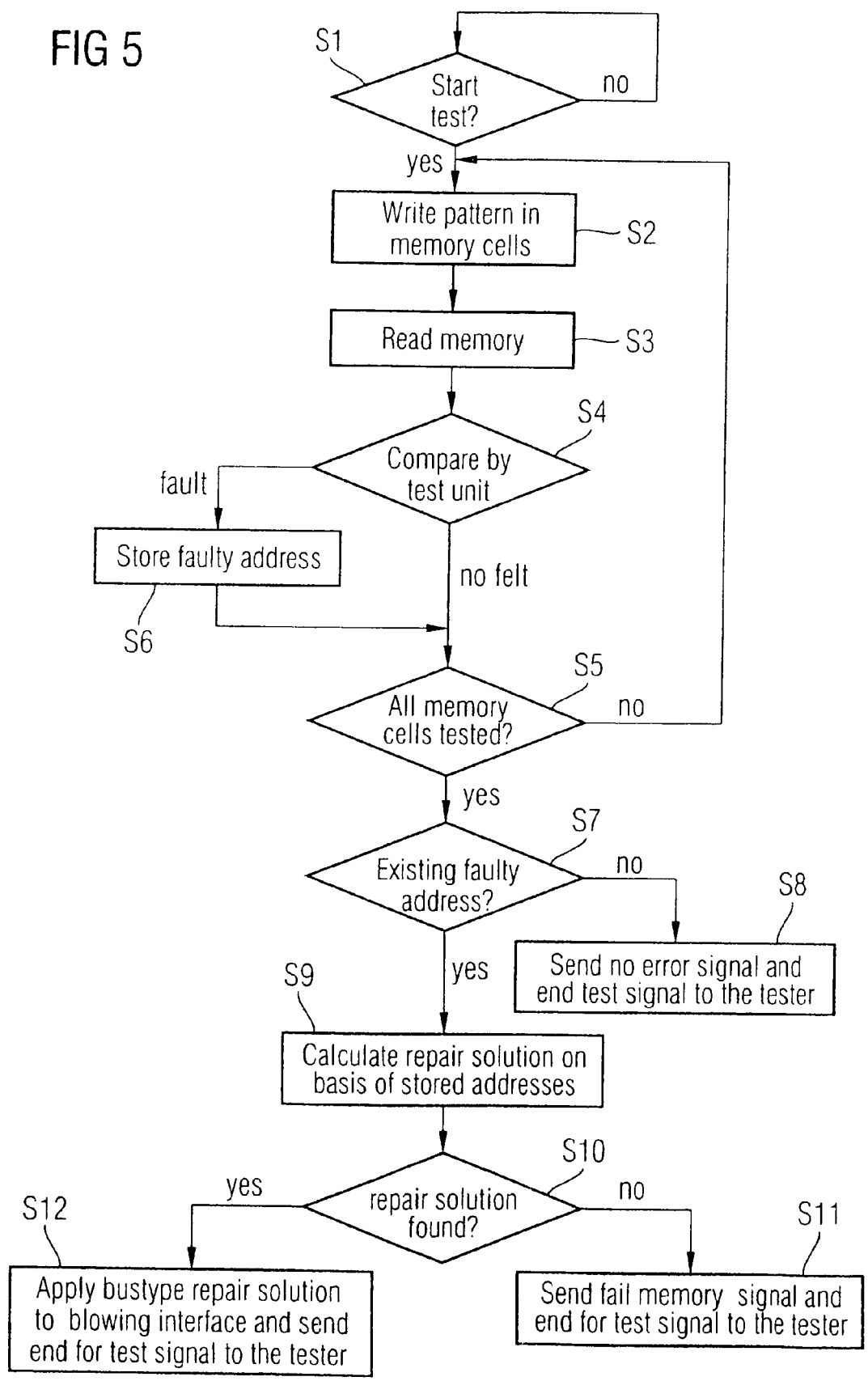

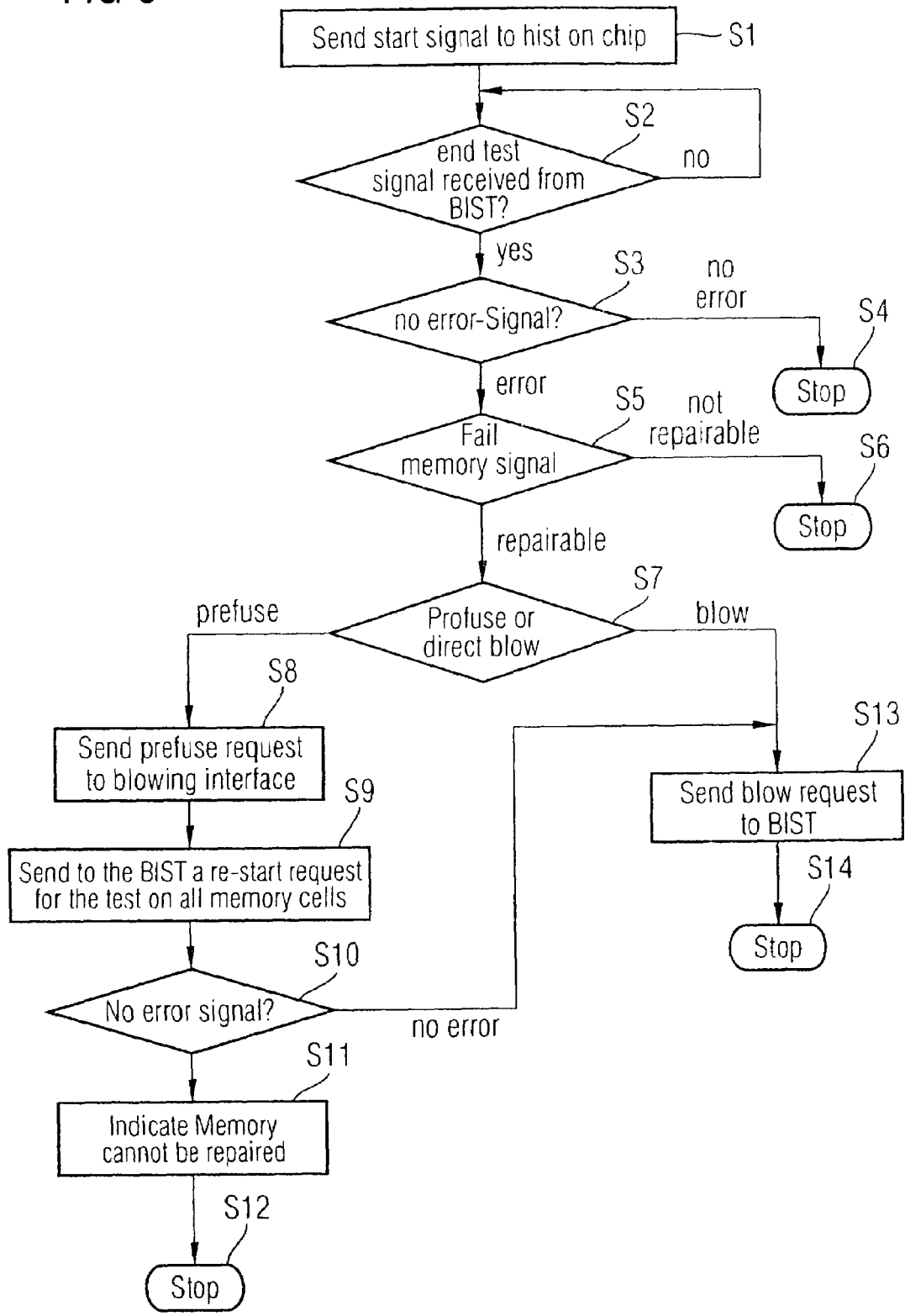

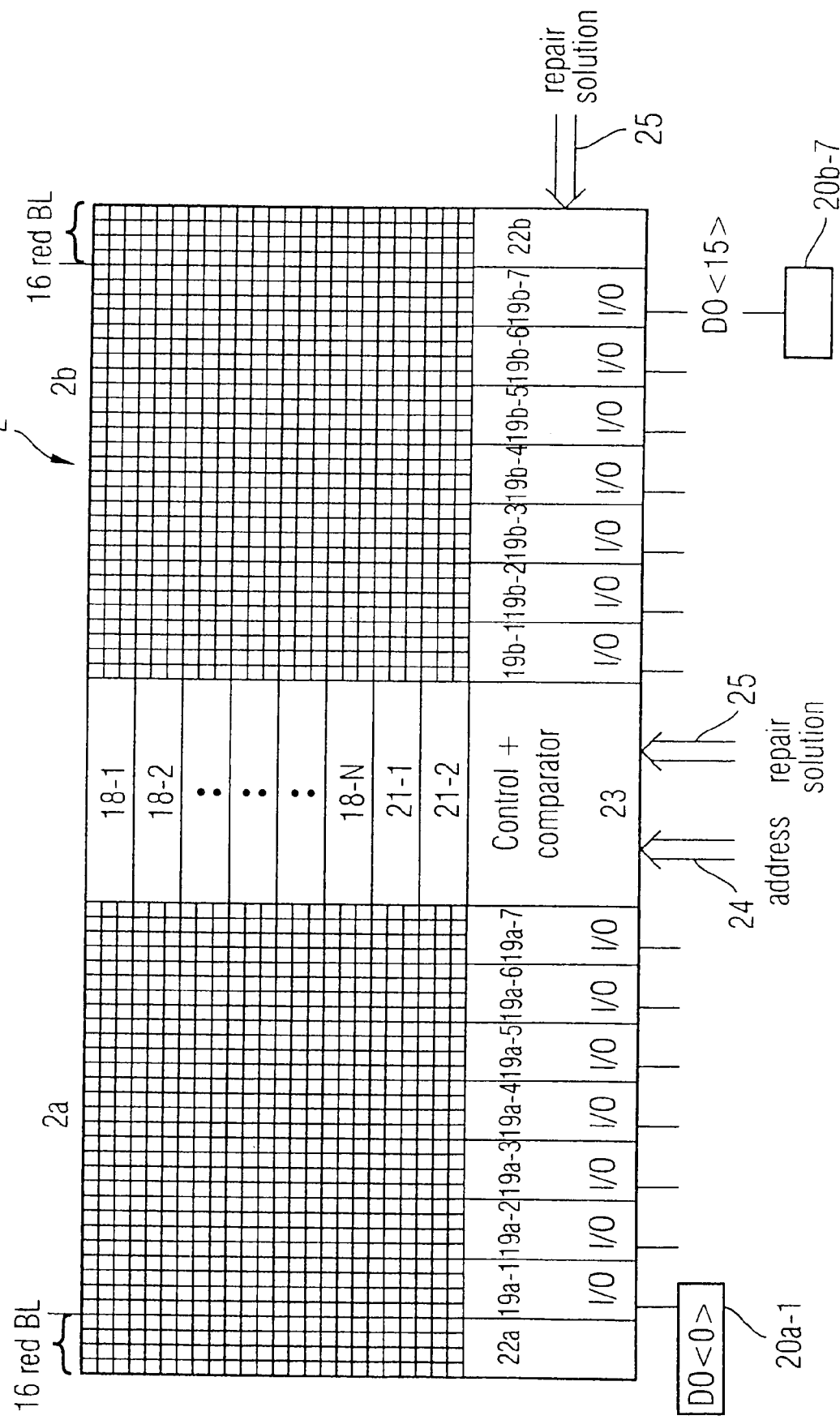

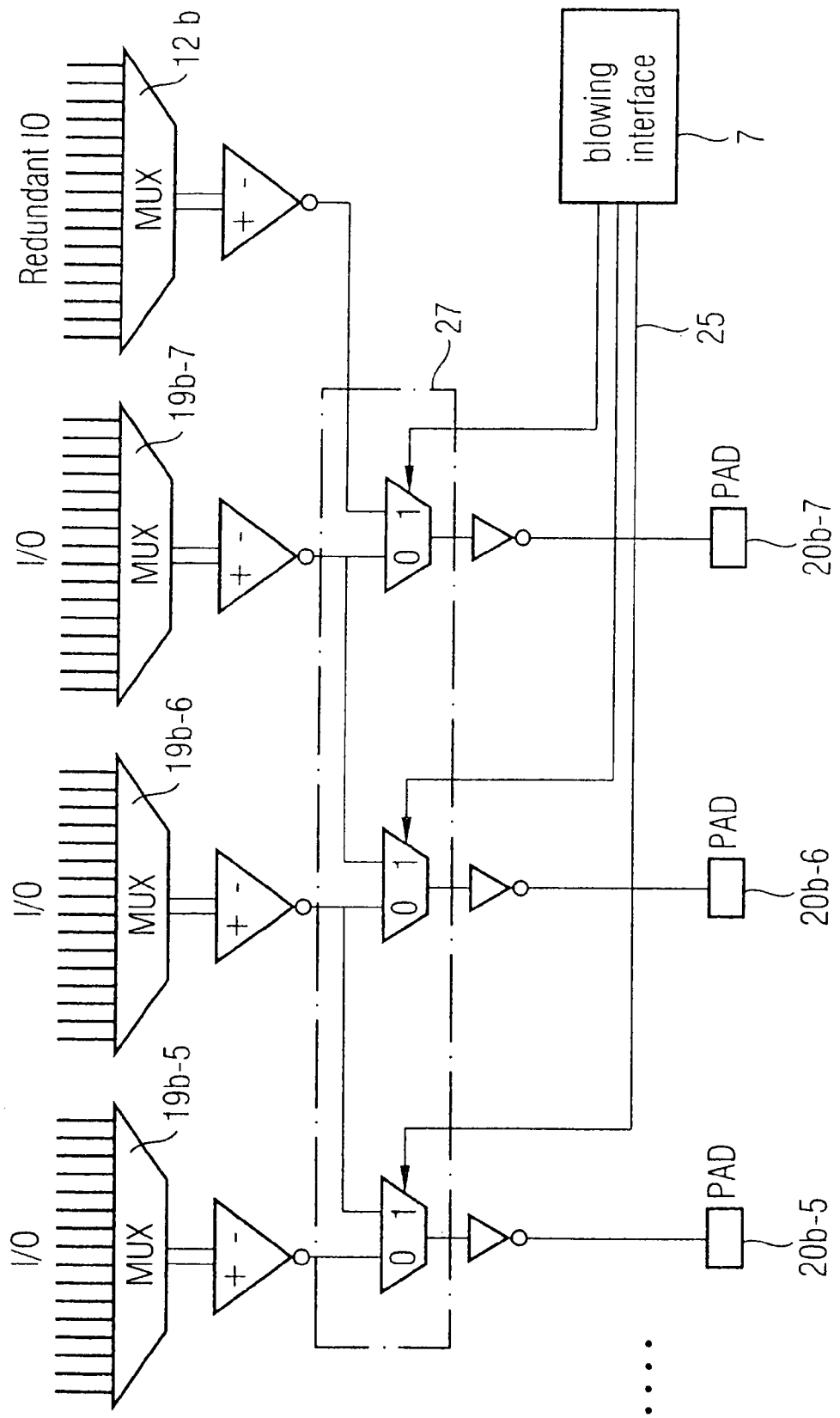

FIG 9

Example with a SRAM 4k x 16 and 2 redundant IO and 2 redundant WL
- Storage : for half memory                                    5b

|        | F. WL     | Fg. BIS | F.WL1     | Fg. BIS1 | Fg. WL2 | F. IO    |
|--------|-----------|---------|-----------|----------|---------|----------|
| line 0 | Max = 255 |         | Max = 255 |          |         | Max = 31 |
| line 1 | "         |         | "         |          |         | "        |
| line 2 | "         |         | "         |          |         | "        |

F.WL     number of the faulty Word-Line
Fg.BIS    Flag if we name a new error on the same WL than F.WL but with a different IO
F.WL1    number of a second faulty Word-Line with the same IO
Fg.BIS1   Flag if we name a new error on the same WL than F.WL1 but with a different IO
Fg.WL2   Flag if we have a third faulty-Line with the same IO
F.IO      Number of the faulty IO

FIG 10A

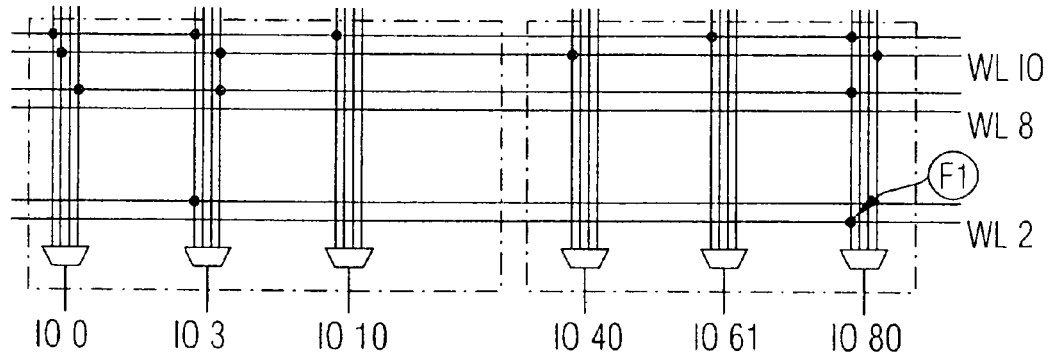

| F.WL | Fg.BIS | F.WL1 | Fg.BIS1 | Fg.WL2 | F.IO |
|------|--------|-------|---------|--------|------|
|      |        |       |         |        |      |
|      |        |       |         |        |      |
|      |        |       |         |        |      |

| F.WL | Fg.BIS | F.WL1 | Fg.BIS1 | Fg.WL2 | F.IO |
|------|--------|-------|---------|--------|------|
| WL.2 |        |       |         |        | IO60 |
|      |        |       |         |        |      |
|      |        |       |         |        |      |

FIG 11

Bus type repair solution

| Flag IO | Nbr of the IO to replace | Flag IO | Nbr of the IO to replace | Flag WL | Nbr of the WL to replace | Flag WL | Nbr of the WL to replace |

FUSE BLOWING INTERFACE FOR A MEMORY CHIP

BACKGROUND OF THE INVENTION

Semiconductor memories are binary data memories in which a plurality of memory cells are provided. The memory cells are addressable by means of wordlines and bitlines. The main memory comprises a matrix of many memory cells connected to address decoding means and sense amplifiers. Addressing a memory cell, i.e. the selection of a memory cell, is performed by activating wordlines which are connected to address decoding means. The data stored in the addressed memory cells are read out by input/output units having sense amplifiers for amplifying the read-out data signal. The input/output units are connected to a data bus by means of which data can be read out from the memory or written into the memory.

When a random access memory is produced, it can happen that some of the memory cells within the matrix are faulty. Accordingly, the produced memory chip is tested, and it is decided whether it can be repaired. For this purpose, there is normally provided an on-chip circuitry to provide testing of the memory chip. The built-in self-test (BIST) is essentially the implementation of logic built into the memory chip to do testing without the use of a tester for data pattern generation on comparison purposes.

FIG. 1 shows the architecture of a memory chip according to the state of the art. The memory chip comprises a main memory with a plurality of memory cells and a redundancy logic having a built-in self-test device. The memory chip is connected to an address bus, a control bus and a data bus. In a test mode, the addresses of the faulty memory cells are detected. The redundancy logic replaces the faulty memory cells within the main memory with memory cells in the form of redundant registers within the redundancy logic. The address applied to the address bus is compared with the addresses of the detected faulty memory cells, and when there is a match, the redundancy logic maps the faulty address to an address of a register cell within the redundancy logic to replace the faulty memory cell. When reading data from the memory chip, the redundancy logic controls a multiplexer connected to the data bus. When accessing data with an address of a faulty memory cell, the data is read from the register replacing the memory cell within the redundancy logic.

In the conventional memory chip as shown in FIG. 1 the fusebox connected to the redundancy logic contains a plurality of fuses. The fuses are laser fuses which are blown by laser light. Alternatively a read only memory (ROM) is used instead of the fusebox. This ROM is for instance a EPROM or EEPROM. For blowing the fuses in the fusebox or for loading the data values into the read only memory the external tester device calculates which fuses have to be blown or what values have to be loaded into the ROM.

To repair a faulty RAM-memory within the memory chip several interactions are needed between the external tester device and the conventional BIST device as shown in FIG. 1. In a failure analysis the external tester device detects the addresses of the faulty memory cells within the RAM memory cell array and calculates a repair solution for repairing the memory cell array on the memory chip. The external tester device computes the fuses which have to be blown or respectively the values to be loaded into the ROM memory. After the repair solution has been calculated the fuses in the fusebox are blown by the external tester device.

The interactions between the external tester device and the memory chip are performed by using huge communication protocols. Consequently blowing of the fuses or loading of the data values into the read only memory takes a long time since the data exchange between the external tester device and the memory chip is extensive.

When using laser fuses within fusebox for operation of the main memory a further disadvantage resides in that the laser fuses have to be blown by laser light. Accordingly to program the fuses it is necessary to have open access through the chip package to the laser fuses. In the testing process this leads to a complicated handling of the memory chips for reparation purposes.

FIG. 2 shows the architecture of a main memory within the memory chip according to the state of the art. In this example, the main memory is a 8k×16 wide memory having 16 input/output units and wordline address decoders (XDEC) for decoding the wordline address or X-address of the memory cells. The input/output units are connected to the memory cell matrix by means of vertical bitlines. The input/output units receive the bitline address or Y-address of the solected memory cell.

The main memory shown in FIG. 2 according to the state of the art is partitioned in two memory hales wherein the X-address decoders are placed in the center. With this architecture, the length of the wordlines is comparatively short so that the parasitic capacitance of the wordlines can be minimized.

Each input/output unit is connected to the 16 bitlines reading data from the addressed memory cell and for writing data into an addressed memory cell.

FIG. 3 shows the architecture of an input/output unit according to the state of the art. For reading out data, the input/output unit comprises multiplexers which are connected to the bitlines of the memory cell matrix. In the shown example, each memory cell is connected to a multiplexer via a couple or pair of bitlines BL, $\overline{BL}$ to provide a differential signal to the input of the multiplexer. In the shown example, each multiplexer has N signal inputs. On the output side, each multiplexer is connected to a differential amplifier and an inverter for amplifying the read-out data signal and to supply the data to a data bus. The multiplexers are controlled by the applied Y-address.

In a conventional memory, there are provided either redundant registers, redundant bitlines and/or wordlines to repair a memory chip in case that faulty memory cells are detected when testing the memory chip.

If the conventional memory chip comprises redundant registers, the number of faulty addresses is limited by the number of redundant registers provided within the redundancy logic. If there are, for instance, 10 redundant registers, it is only possible to repair 10 faulty addresses. When an address is "faulty", the address is stored in a redundant register. Since the number of faulty addresses detected by the main memory, it is not known before testing a considerable number of registers have to be provided within the redundancy logic to guarantee the repair of the chip even when a lot of memory cells are detected to be faulty.

In case that the memory chip comprises redundant bitlines and/or wordlines, the repair method is much more complex, because all errors have to be known in advance before the error pattern can be diagnosed and an optimal repair solution can be calculated. Storing detected memories with a conventional method implies a very large array.

Such an array needs a lot of space on the memory chip, thus increasing costs when producing the memory chip.

The test diagnose repair performed with an external tester device as shown in FIG. 1 has the main disadvantages that it takes a long time to load the fuses within the fusebox because a very extensive data exchange is necessary between the external tester device and the memory chip. The communication between the external tester device and the memory chip is performed by using predetermined data protocols thus increasing redundancy of data exchange between the tester device and the memory chip. By increasing the reparation time of the memory chip the production costs of the memory chips are also increased.

Accordingly it is the object of the present invention to provide a fuse blowing interface which allows to repair a memory chip within a minimum time span.

SUMMARY

This object is achieved by embodiments of the invention.

The invention provides a fuse blowing interface for a memory chip comprising a latch register for latching a calculated memory repair solution when a prefuse request signal is received from an external tester device and a fuse blowing unit with electrical fuses which are blown according to the calculated memory repair solution when a blow request signal is received from the external tester device.

By providing a fuse blowing interface within the memory chip the blowing of fuses is self controlled by an internal logic. For blowing the fuses the external tester device has only to provide a prefuse request signal followed by a blow request signal. A complicated data exchange with huge data protocols between the external tester device and the memory chip for blowing the fuses is not necessary. This leads to a remarkable decrease of the necessary repair time.

An advantage of the fuse blowing interface according to the present invention is that electrical fuses are employed and not laser fuses as in conventional memory chips. Consequently the reparation of the memory chip can be performed with a closed memory chip package making it is easier to handle a memory chip during reparation.

In a preferred embodiment of the fuse blowing interface according to the present invention the interface comprises a multiplexer which applies in a first mode the output of the latch register to the memory cell array of the memory chip and when prefuse request signal is received from the external tester device and which applies in a second mode the output of the fuse blowing unit to the memory cell array of the memory chip after the blow request signal has been received from the external tester device.

The fuse blowing interface according the present invention is switchable between two modes. In the first mode the calculated memory repair solution is stored by the latch register and the electrical fuses in the fuse blowing unit are not blown. By latching a calculated memory repair solution without blowing the fuses permanently it is possible to test the memory cell array again and to check whether the calculated memory repair solution is correct. After it has been decided that the latched memory repair solution leads to a repaired memory cell array the electrical fuses within the fuse blowing unit are blown permanently by sending a blow request signal to the fuse blowing interface in a second mode.

Since the fuse blowing interface according to the present invention allows two operation modes it is possible either to perform the reparation in a two stage process i.e. in a first step latching the calculated repair solution (prefuse step) and in a second step blowing the electrical fuses permanently (blow step), or to blow the electrical fuses directly without prefuse, i.e. without checking whether the calculated memory repair solution leads to a repaired memory cell array. The direct blow without prefuse has the advantage that further repair time can be saved.

In a further preferred embodiment of the fuse blowing interface according to the present invention the latch register comprises clock triggered flip-flop circuits for latching the memory repair solution calculated by a repair unit.

Each flip-flop has preferably an enabling input connected to the external tester device for receiving the prefuse request signal via a control line.

In a preferred embodiment the clock triggered flip-flop circuit of the latch register are connected in parallel.

The number of flip-flop circuits of the latch register corresponds in a preferred embodiment to the word widths of the calculated memory repair solution.

In a preferred embodiment each flip-flop of the latch register has an output connected to first input terminals of a multiplexer.

In a preferred embodiment of the fuse blowing interface according to the present invention the fuse blowing unit comprises a clocked blow control logic which blows a group of electrical fuses according to the memory repair solution calculated by the repair unit when the blow request signal is applied from the external tester device via a control line.

Provision of electrical fuses instead of laser fuses has the advantage that the chip package can be closed during reparation of the memory cell array.

In a preferred embodiment of the fuse blowing interface according to the present invention the electrical fuses are connected in parallel.

The number of parallel connected electrical fuses for corresponds in a preferred embodiment to the word width of the calculated memory repair solution.

In a preferred embodiment of the fuse blowing interface according to the present invention the electrical fuses are blown by applying an overcurrent.

In a preferred embodiment the blow control logic blows the electrical fuses according to the memory repair solution sequentially.

In a preferred embodiment in each clock cycle of the clock signal one electrical fuse is blown by the blow control logic according to the memory repair solution.

This has the advantage that the electrical fuse can be blown reliably with a minimum necessary amount of electrical power supplied to the memory chip.

In a preferred embodiment of the fuse blowing interface according to the present invention the calculated memory repair solution comprises the numbers of Input/Output units of the memory cell array which have to be replaced by a redundant Input/Output units and numbers of wordlines of the memory cell array which have to be replaced by redundant wordlines connected to corresponding redundant x-address decoders.

The invention first provides a memory chip with self controlled fuse blowing comprising a memory cell array with a plurality of memory cells which are addressable by means of wordlines and bitlines, wherein the memory cell array has redundant memory cells for repairing faulty memory cells, a built-in self test-unit having a test unit for detecting faulty memory cells in the memory cell array, a diagnose unit for storing logically errors detected in the memory cell array, a repair unit for calculating a memory repair solution and a fuse blowing interface including a latch register for latching the calculated memory repair solution when a prefuse request signal is received from an external tester device via a first control line, a fuse blowing unit with several electrical fuses which are blown according to the calculated memory repair solution when a blow request signal is received from the external tester device via a second control line, and a multiplexer which applies the output of the latch register to the memory cell array in a first mode when the prefuse request signal is received and which applies the output of the fuse blowing unit to the memory cell array in the second mode when the blow request signal has been received from the external tester device.

A preferred embodiment of fuse blowing interface and the memory chip according to the present invention is described with reference to the enclosed figures:

BRIEF DESCRIPTION OF THE DRAWINGS

FIG. 4 shows the architecture of a memory chip according to the present invention;

FIG. 5 shows a flow chart of a program within a built in test unit according to the present invention;

FIG. 6 shows a flow chart of a program run by a tester according to the present invention;

FIG. 7 shows a memory cell array within a memory chip according to the present invention;

FIG. 8 shows an input/output unit within a memory chip according to the present invention;

FIG. 9 shows a preferred embodiment of a diagnose array in the memory chip according to the present invention;

FIG. 11 shows the data structure of a repair solution applied by the blowing interface to the memory cell array according to a preferred embodiment of the present invention;

DETAILED DESCRIPTION

Figure 1:
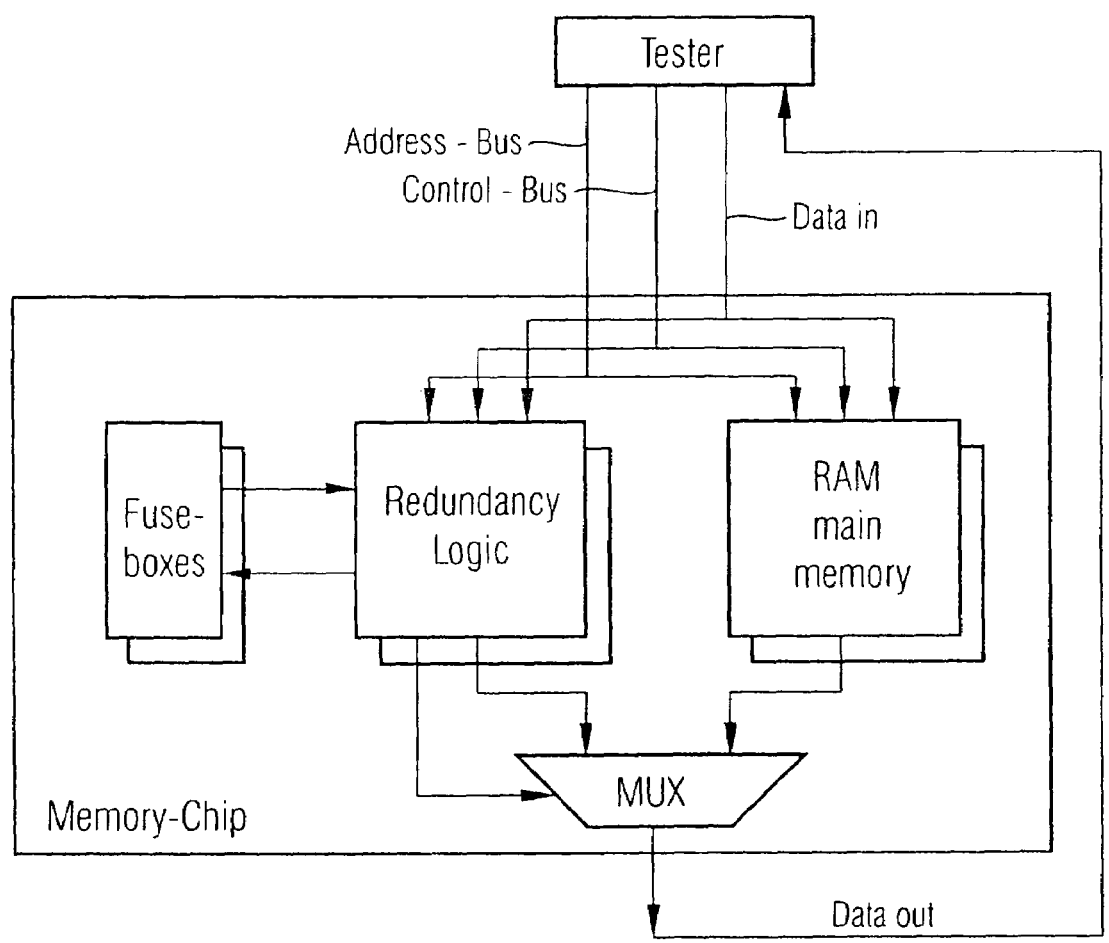
FIG. 1 shows a memory chip with a redundancy logic according to the state of the art.

EP 02022312.9 describes a method for storing detected errors of a main memory in a separate diagnose array within the diagnose unit having a minimum storage size, wherein the faulty main memory to be repaired comprises a plurality of memory cells which are addressable by means of wordlines connected to wordline address decoders and by means of bitlines connected to input/output units, wherein said method comprising the following steps:

(a) providing a faulty diagnose array having several lines, wherein the number of lines is equal to the number of independent errors of the faulty main memory to be repaired, wherein in each line of said diagnose array are storable:

(a1) at least one wordline number of a wordline of a detected faulty memory cell, (a2) an input/output unit number of an input/output unit of the detected faulty memory cell, (a3) at least one first flag which indicates whether a new error on the same wordline, but with a different input/output unit has occurred, and (a4) a second flag which indicates whether a further faulty wordline with the same input/output unit has occurred;

(b) comparing the wordline number and the input/output number of the detected faulty memory cell with the data content of the fault diagnose array, (b1) if the wordline number and the input/output unit number of the detected faulty memory cell are already stored in a line of said array, then no update of said fault diagnose array is performed, (b2) else, if the input/output unit number of the detected faulty memory cell is already stored in a line of said fault diagnose array, the wordline number is stored in said line, (b3) else, if the wordline number of the detected faulty memory cell is already stored in a line of said array, a first flag is set in said line, (b4) else, if a further line is available in said fault diagnose array, the wordline number and input/output unit number of the detected faulty memory cell is written into said further line, (b5) else, it is indicated that the main memory cannot be repaired.

The detected errors stored in said diagnose array are analyzed to select wordlines and input/output units to be replaced by redundant wordlines and redundant input/output units of said main memory. Analyzing the errors is performed by a control unit within said diagnose unit connected to said diagnose array. Analyzing the errors comprises the following steps for each line of said diagnose array, if the first flag is set within the line, it is decided that the corresponding wordline is to be replaced by a redundant wordline;

if the second flag is set within the line, it is decided that the faulty input/output unit is to be replaced by a redundant input/output unit;

if the second flag is not set and the first flag is not set, it is decided that either the faulty input/output unit is replaced by a redundant input/output unit or the faulty wordline by a redundant wordline.

As described in EP 02022312.9 the diagnose unit controls a repair unit to program fuses for replacing wordlines by redundant wordlines and input/output units by redundant input/output units according to the analyzing result.

The memory chip described in EP 02022312.9 comprises a main memory with a plurality of memory cells which are addressable by means of wordlines connected to wordline address decoders and by means of bitlines connected to input/output units, wherein the main memory has redundant wordlines connected to redundant wordline address decoders and redundant bitlines connected to redundant input/output units;

a built-in self-test unit for detecting faulty memory cells in said main memory, a diagnose unit having a diagnose array for storing logically detected errors of the main memory.

In each line of the diagnose array are storable at least one wordline number of a wordline connected to a detected faulty memory cell, an input/output unit number of an input/output unit connected to the detected faulty memory cell, at least one first flag which indicates whether a new error on the same wordline, but with a different input/output unit has occurred, and a second flag which indicates whether a further faulty wordline with the same input/output unit has occurred.

The diagnose unit analyzes the detected errors stored in said diagnose array to select wordlines in the input/output units to be replaced by redundant wordlines and redundant input/output units of said main memory.

The diagnose unit controls a repair unit to program fuses for replacing wordlines by redundant wordlines and input/output units by redundant input/output units according to the analyzing result.

As can be seen from FIG. 4, the memory chip 1 according to the present invention comprises a memory cell array 2 with a built-in redundancy. The memory cell array 2 comprises a plurality of memory cells which are addressable by means of wordlines and bitlines. The memory 2 comprises redundant wordlines and redundant bitlines which are provided for repairing faulty memory cells. The memory cell array 2 is connected to a built in test-unit 3, comprising a test-unit 4, a diagnose unit 5 and a repair unit 6. The repair unit 6 is connected to a blowing interface 7 which is provided for replacing wordlines by redundant wordlines and input/output units by redundant input/output units within the memory cell array 2.

The test unit 4 performs a test of the memory cell array 2 within the chip 1 and checks whether there are any memory cells which are defect. The diagnose unit 5 consists of a control unit and a diagnose array. The diagnose array is provided for storing logically detected errors within the main memory 2 found by the test-unit 4 in a test mode. The control unit controls the storing of detected errors of the main memory 2 in the separate diagnose array within the diagnose unit 5. FIG. 9 shows an example of a table stored within the diagnose array. The storing of errors is performed in such a way that the necessary storage capacity or storage size of the diagnose array is minimized. The diagnose array stores in a logical manner the errors found in the memory cell array 2. The control unit within the diagnose unit 5 controls the storing of detected errors into the diagnose array and analyzes the stored errors to select wordlines and input/output units within the memory cell array 2 to be replaced by redundant wordlines and redundant input/output units. Depending on the analyzing result, the repair unit 4 calculates a repair solution. On the basis of the repair solution the blowing interface 7 performs a pre-fuse to replace wordlines and Input/Output units of faulty memory cells by redundant wordlines and redundant input/output units. In the next step, the provisionally repaired memory 2 is tested again, and if no further errors are detected, the fuses within the blowing interface 7 are blown.

As can be seen from FIG. 4 the memory chip 1 comprises a built in self test-unit 3 having a test unit 4, a diagnose unit 5 a repair unit 6 and a blowing interface 7. The built in self test unit 3 is connected to the memory cell 2 via an internal address bus A and an internal data bus DI, DO. Further the built in self test-unit 3 controls the memory cell array by control signals CS (chip select) and a read/write control signal (RW). The memory cell array 2 comprises a plurality of memory cells which are addressable by wordlines and bitlines. To this end the memory cell array 2 comprises redundant memory cells for repairing faulty memory cells. This and the memory cell 2 includes redundant output units and redundant X-address decoders as shown in FIG. 7.

The test-unit 4 within the self test-unit 3 is provided for detecting faulty memory cells within the memory cell array 2.

The test unit 4 generates a test data pattern which is written into the memory cells. In a next step the addressed memory cells are read by the test-unit and the retrieved data are compared with the originally applied test data. If it is detected that a memory cell is faulty the diagnose unit stores the address of the faulty memory cell in a table in case that this address is not stored already. The diagnose unit 5 hands the table of faulty addresses over to the repair unit which calculates a memory repair solution as described in connection with FIGS. 10a to 10g.

The calculated memory repair solution is applied to the fuse blowing interface 7 according to the present invention. The fuse blowing interface 7 comprises a latch register for latching the calculated memory repair solution when a prefuse request signal is received from an external tester device 8 via a first control line 9 as shown in FIG. 4. The fuse blowing interface 7 further comprises electrical fuses which are blown according to the calculated memory repair solution when a blow request signal is received from the external tester device 8 via a second control line 10 as shown in FIG. 4. The built in self test-unit 3 is connected to the external tester device 8 by further control lines 11 to 14. Via control line 11 the built in self test-unit 3 receives a start-to-test-signal from the external tester device starting the test procedure of the test unit 4. When the testing is finished this is indicated to the test device 8 via control line 12. In case that the built in self test-unit 3 detects that the memory is not repairable it sends a failed memory signal to the tester device 8 via control line 13. In case that it is detected that no error has occurred the built in self test-unit 3 sends a corresponding message to the tester device 8 via control line 14.

The test-unit 4 hands over the addresses of the faulty memory cells to the diagnose unit 5 via data lines 15. The diagnose unit 5 sends the table of originally detected errors to the repair unit via data lines 16. The repair unit 6 applies the calculated memory repair solution to the fuse blowing interface according to the present invention via lines 17.

FIG. 5 shows a flow chart of the reparation process performed by the built in self test-unit 3 as shown in FIG. 4.

In a first step S1 the built in self test-unit 3 checks whether it has received a start signal from the external tester device 8 via control line 11.

After the start test control signal has been received the test unit 4 writes a test data pattern into the memory cells of the memory cell array 2 in an step S2.

The written memory cells are then read by the test-unit 4 in a further step S3.

In step S4 the test-unit 4 compares the originally test data pattern applied to the memory cells with the data read from the memory cells.

If the test data pattern is identical with the read out data it is decided that no faulty memory cell is provided in the tested memory segment and the procedure continues with step S5.

If the test data pattern is not identical with the data read from the tested memory cell the address of the faulty memory cell is stored in step S6 by the diagnose unit 5.

In step S5 it is checked if all memory cells in the memory cell array 2 have been tested. The loop between steps S2 to S5 is performed until all memory cells within the memory cell array have been tested.

In step S6 it is checked whether any faulty addresses have been detected by the test-unit 4 in a step S7.

In case the memory cell array 2 does not contain any faulty memory cells the built in test-unit 3 sends a no error signal and an end test signal to the external tester device 8 via control lines 12, 14 in a step S8.

If it is decided in step S7 that faulty addresses have been detected the diagnose unit applies a table of faulty addresses to the repair unit 6 via data lines 16 and the repair unit 6 calculates a memory repair solution on the basis of the stored addresses in step S9.

In a further step S10 it is decided by the repair solution whether a calculated repair solution could be found or not.

If no sufficient repair solution for repairing the memory cell array 2 could be calculated the built in self test-unit 3 sends a failed memory signal and an end test signal to the external tester device 8 via control lines 12, 13 in a step S11. In this case the memory chip 1 can not be repaired and has to be dismissed.

If it is decided that a sufficient repair solution could be calculated in step S10 the repair unit 6 applies the calculated memory repair solution for blowing the fuses within the fuse blowing interface 7 via lines 17 and sends an end test signal to the external tester device via control line 12 in a step S12.

FIG. 6 shows a further flow chart of a preferred embodiment of the program run in the external tester device 8.

In step S1 the external tester device 8 sends a start signal to the memory chip 1 via control line 11.

In step S2 the external tester device 8 waits until an end test signal has been received from the built in self test-unit 3 via line 12.

After the end test signal has been received the external tester device 8 checks whether a no error signal has been received via line 14 in step S3.

In case that no error signal has been received no reparation is necessary and the procedure stops in step S4.

If it is decided in step S3 that an error has occurred the external tester device 8 checks in step S5 whether a failed memory signal has been received via line 13. In case that a failed memory signal has been received the memory chip 1 is decided by the external tester device 8 to be not repairable and the procedure stops in step S6.

In case that the memory chip 1 is decided to be repairable in step S5 the external tester device 8 checks whether a prefuse or a direct blow of the electrical fuses is desired in step S7. Whether a prefuse or a direct blow has to be performed can be decided by a user by inputting a control signal to the tester device 8 or by the software run within the tester device 8.

In case that it is decided in step S7 to perform first a prefuse of the electrical fuses the external tester device 8 sends a prefuse request signal to the blowing interface 7 via control line 9 in step S8.

Further in a step S9 the external tester device 8 sends another start test signal via control line 11 to the built in self test-unit 3 to restart the test procedure for all memory cells within the memory cell array 2.

The test of the memory cells is a rerun and it is checked whether the calculated repair solution and the blown fuses lead to a repaired memory cell array 2.

In step S10 the tester device 8 checks whether it has received no error signal from the built in self test-unit 3 via control line 14 in step S10.

In case that there is still an error the tester device 8 indicates that the memory chip 1 can not be repaired in a step S11. After this the procedure stops in step S12.

When in step S10 the external tester device 8 realizes that no error signal has been received from the built in self test-unit 3 it sends a blow request signal to the fuse blowing interface 7 via control line 10 in a step S13. The fuse blowing interface 7 blows the fuses permanently to repair the memory cell array 2. By blowing the fuses permanently the memory repair solution is stored for all time even when the memory chip 1 does not receive a power supply. After step S13 the procedure stops in step S14.

FIG. 7 shows a memory cell array 2 within a memory chip 1 as shown in FIG. 5. In the embodiment shown in FIG. 7, the memory cell array 2 is partitioned in two memory halves 2a, 2b, each half having a matrix of memory cells. The memory cells are connected to x-address-decoders 18 and to input/output units 19. The input/output units 19 are connected to data input/output pads 20 of the memory chip 1. In the given example, each input/output unit 19 is connected to 16 bitlines.

As can be seen from FIG. 7, the memory 2 further comprises redundant X-address decoders 21 and redundant input/output units 22a, 22b. Further, a control and comparator unit 23 is provided connected to the address bus 24 and to the fuse blowing interface 7 via lines 25.

FIG. 8 shows the architecture of the input/output units 19 in the memory chip 1 according to the present invention. As can be seen from FIG. 8, there is provided a redundant input/output unit 22b which may be activated by the blowing interface 7. The blowing interface 7 is connected via control lines 26 to multiplexers within a multiplex stage 27. The blowing interface 7 comprises the information data on the input/output unit 19 to be replaced by the redundant input/output unit 22b. A control signal is supplied to the multiplexer stage 27 to block the input/output unit 19 which is connected to at least one faulty memory cell within the memory cell array 2 and which is decided to be replaced from the corresponding data pad 20. Further, the redundant input/output unit 22b is connected to pad 19b-7 as a substitute. The redundant input/output unit 22b is activated by the blowing interface 7. Providing the additional multiplexer stage 27 has almost no impact on the signal delay.

FIG. 9 shows a preferred embodiment of a diagnose array within a diagnose unit 5. In the diagnose array a fault diagnose table is stored for each half 2a, 2b of the memory cell array 2. The fault diagnose array has several lines, wherein the number of lines is equal to the number of independent errors which can be repaired in the faulty main memory 2.

In the given example shown in FIG. 9, three lines, line 0, line 1, line 2, are provided. The diagnose array shown in FIG. 9 comprises several columns. The first column F.WL indicates the number of a faulty wordline detected in the memory cell array 2. The next column Fg.BIS is a flag which is set when there is a new error on the same wordline as in F.WL, but with a different input/output unit. In the next column F.WL1, the wordline number of a second faulty wordline with the same input/output unit can be stored. Fg.BIS1 is a flag which indicates when set that there is a new error on the same wordline as F.WL1, but with a different input/output unit. Fg.WL2 is a flag which is set when there is a third faulty wordline with the same input/output unit. In the last column F.IO, the input/output unit number of the faulty input/output unit of the memory cell array 2 can be stored. Based on the table shown in FIG. 9 a solution to repair the memory is calculated having the format shown in FIG. 11.

FIG. 10a to 10f show an example of filling the diagnose array shown in FIG. 9.

As can be seen from FIG. 10a, when test-unit 4 detects an error F1 of a faulty memory cell connected to wordline WL2 and input/output unit 60 in the right memory half 2b, the X-address of the detected wordline is stored in the first column, and the number of the faulty input/output unit 60 is stored in the last column of line 0 in the right table.

Figure 10B:
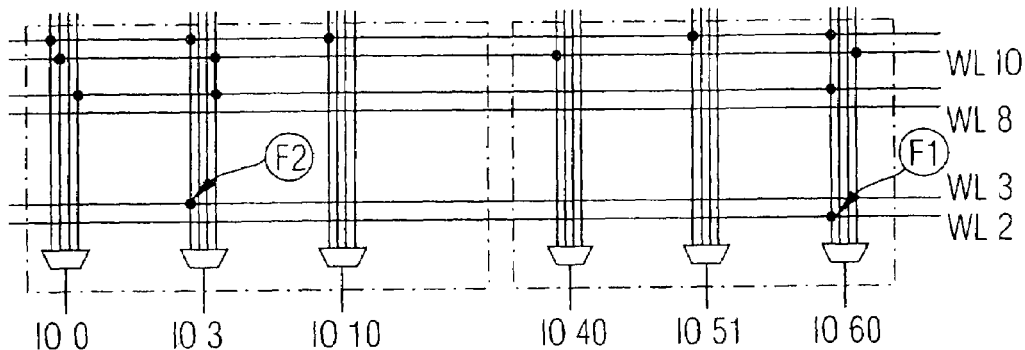
FIG. 10 shows the process of storing detected errors of the main memory in the diagnose array of a memory chip according to the present invention.

As shown in FIG. 10b, next a further defect memory cell F2 is detected which is connected to the input/output unit 3 and to the wordline 3. Each wordline comprises a couple of wordlines for supplying a differential signal. As the fault is on wordline WL3 and always one couple of wordlines is repaired, WL3 is considered to be equal to wordline WL2 for the storage. The number of the faulty wordline WL2 and the number of the faulty input/output unit 103 are stored in the left table.

Figure 10C:
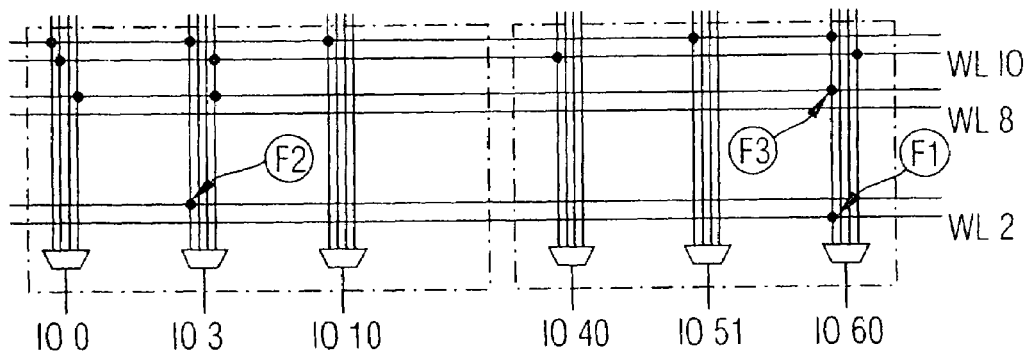

Next, as can be seen from FIG. 10c, a further error F3 is found. The faulty memory cell is connected to wordline 8 and input/output unit 60. The number of the second faulty wordline and the input/output unit 60 are stored in the column F.WL1 of the right table.

Figure 10D:
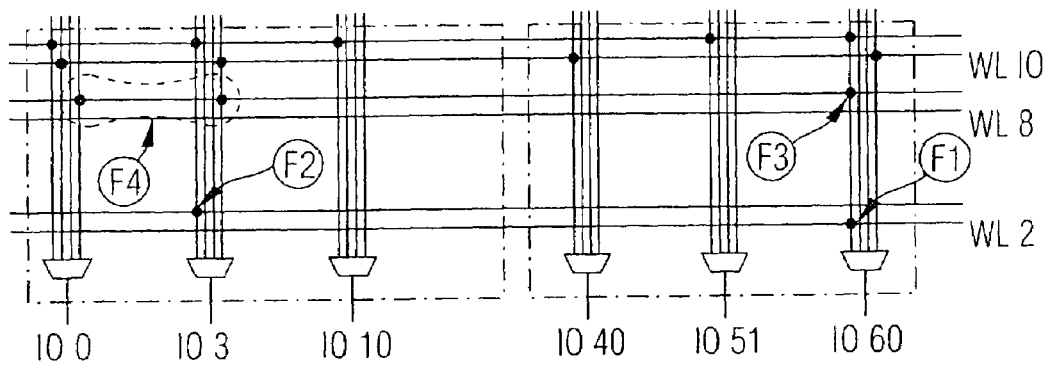

FIG. 10d shows the situation after a further error F4 is detected. As can be seen from FIG. 11d, two defect memory cells connected to wordline 8 are detected. The left table is updated by storing the number of the detected wordline WL8 indicating the second faulty cell in this wordline with the same input/output unit 103, and a flag Fg.BIS1 is set indicating that there is a new error on the same wordline WL8, but with a different input/output unit (in this case input/output unit IO0).

Figure 10E:
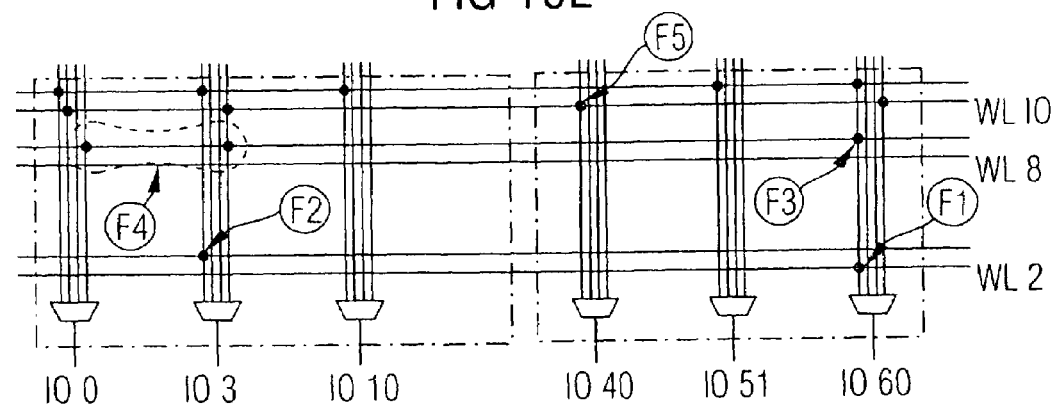

A further error is detected, as can be seen from FIG. 10e. The next error F5 results from a faulty memory cell connected to wordline 10 and input/output unit 40. Since a new input/output unit 40 is concerned, a new line in the right table is activated and the wordline number of the detected faulty address WL10 is written into this line.

Figure 10F:
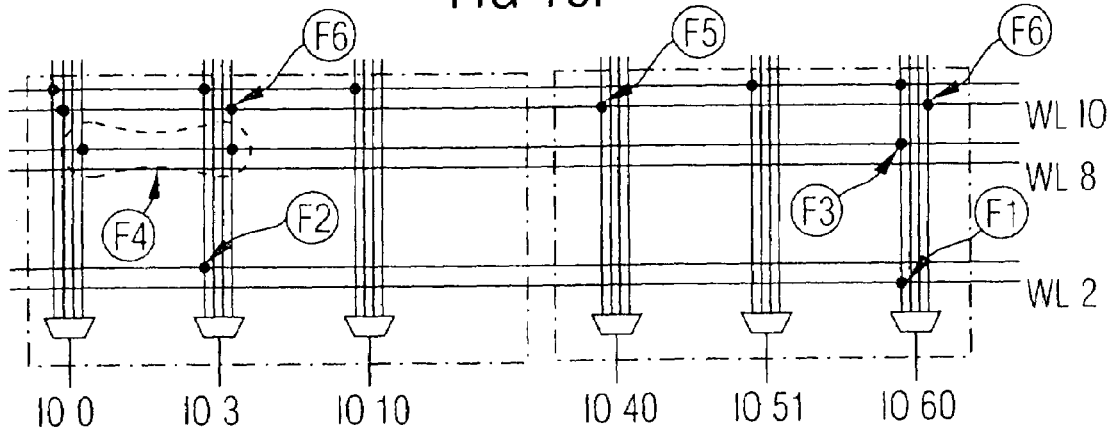

FIG. 10f shows the situation after two additional errors F6 are found. The flag Fg.WL2 in the right table indicates that a third faulty memory cell has been found in wordline 10 connected to the same input/output unit 1060. In the left table, flag Fg.WL2 indicates that a third faulty memory cell has been found connected to wordline WL10 and the same input/output unit 103.

Figure 10G:
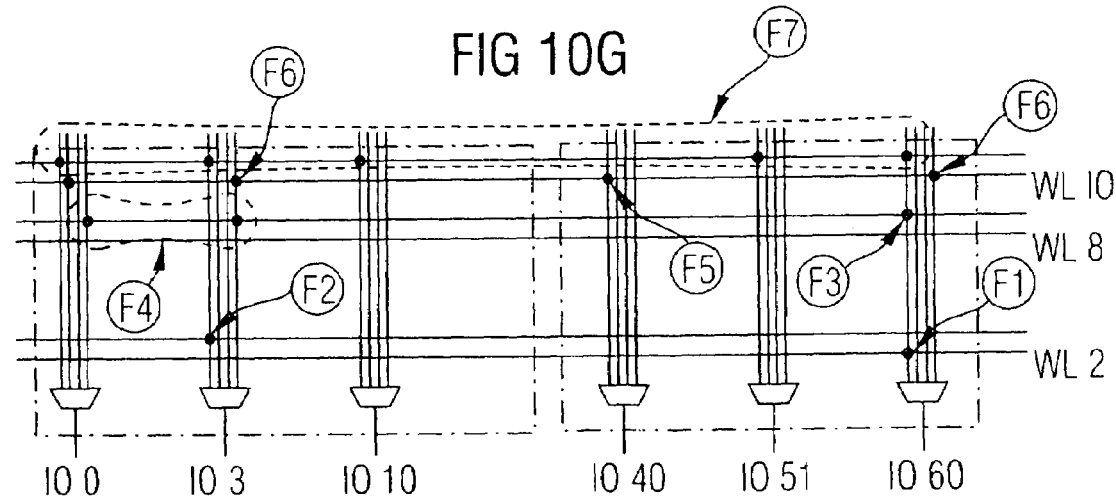

FIG. 10g shows the situation after finding an error F7 consisting of five faulty memory cells connected to wordline W110. Fg.BIS indicates that there is a new error on the same wordline, but with a different input/output unit.

In the given example in FIG. 10a–10g is a 4k×64 SRAM 2 having two redundant input/output units and two redundant wordlines. A different kind of redundancy can be used in a memory cell array 2. Possible redundancies are, for example, two redundant wordlines and two redundant input/output units, one redundant wordline and two redundant input/output units, two redundant input/output units, two redundant wordlines or merely one redundant wordline. It is for example possible to repair three independent errors, if there are provided two redundant wordlines and one redundant input/output unit. An independent error is an error when the faulty addresses and the input/output units are different. The first independent error can be repaired by replacing the wordline by a redundant wordline. The second error can also be repaired by replacing a wordline with the second redundant wordline, and a third error is repaired by using a redundant input/output unit. If a further error occurs in this situation, either this new error is on the same wordline or input/output unit than a previous error, and it is possible to repair this additional error. If the new error is in a new wordline or the faulty memory cell is connected to another input/output unit than previous errors, this additional error cannot be repaired, and the main memory 2 remains defect.

Each error is memorized by storing its wordline and its input/output unit in a line of the diagnose array. The number of lines required in that array is equal to the number of independent errors which should be repaired with redundancy. If it is decided to repair three independent errors, an array with three lines has to be provided. If more independent errors have to be considered, the number of lines has to be increased accordingly.

The following listing shows an algorithm for storing detected errors of a main memory 2 in the separate diagnose array as shown in FIG. 9. In the given example, two redundant wordlines and two redundant input/output units are provided.

```
FOR each error detected
    IF WL and IO are already stored in a line of the
    diagnose array
        No action required
    ELSE IF IO is already stored in a line of the diagnose
    array
        Update the WL info (fill F.WL1 or Fg.WL2 if F.WL1
        already filled) of the concerned line
    ELSE IF WL is already stored in a line of the diagnose
    array
        Update the WL info (fill Fg.BIS or Fg.BIS1) of the concerned
        line
    ELSE IF a line is available
        Write a new line (fill F.WL and F.IO)
    ELSE
        Memory cannot be repaired
    END IF
END FOR
```

The next listing shows an algorithm to analyze detected errors stored in the diagnose array.

```
FOR each line
    IF Fg.BIS = '1' THEN
        The F.WL must be repaired with a redundant WL
    END IF
    IF Fg.BIS1 = '1' THEN
        The F.WL1 must be repaired with a redundant WL
    END IF
    If Fg.WL2 = '1' THEN
        The F.IO must be repaired with a redundant IO
    ELSE
        IF Fg.BIS = '0' and/or Fg.BIS1 = '0' THEN
            We can repair either the F.IO with a redundant
            IO either the F.WL with the first redundant WL
            and the F.WL1(if filled) with he second
            redundant WL
    END IF
END FOR
```

If, for example, the diagnose table has the data content as shown in FIG. 10g in the left array, the first line flag Fg.BIS1 which is set indicates that wordline WL8 has to be repaired. Flag Fg.WL2 which is also set indicates that the input/output unit 103 has to be repaired. In the second row, flag Fg.BIS indicates that wordline WL10 has to be repaired.

Analyzing the right half of the array shows in the first line that flag Fg.WL2 is set so that the input/output unit IO60 has to be repaired. In the second line, flag Fg.BIS is set indicating that the wordline WL10 has to be repaired.

The analyzing step indicates that wordlines WL8, input/output unit 3, wordline 10, input/output unit 60 and wordline 10 have to be repaired. Since wordline 10 is a double match, the diagnose unit 5 can control the repair unit 6 in such a way that the repair unit 6 programs fuses within blowing interface 7 to repair wordline 8, input/output unit 3, wordline 10 and input/output unit 60. The repair is performed by substituting found wordlines and input/output units by redundant wordlines and redundant input/output units provided in the main memory 2 of the memory chip 1.

The necessary storage capacity of the diagnose array shown in FIG. 9 is low so that the necessary chip area for implementing this diagnose array is very small. A further advantage of the memory chip 1 is that the area necessary for the error storage is independent of the size of the memory to be repaired. The diagnose of the best repair solution can be performed very fast, because during the BIST-algorithm performed by the built-in self-test unit 3 of the memory chip 1, a pre-treatment has already occurred, i.e. the faulty wordlines and input/output units are already detected. In the given example, the diagnose unit 5 needs only five clock cycles to calculate the repair solution. In a conventional memory chip, the diagnose unit needs a number of clock cycles that depends on the respective memory size of the main memory. The error storing method is independent of the architecture of the memory 1, independent of the used BIST-algorithm and independent of the kind of memory, i.e. the method can be used for all kind of memories such as SRAM, DRAM and CAM. It is possible to store all errors detected in a memory in an array with a minimum storage size depending only on the kind of redundancy, i.e. the number of redundant wordlines and/or redundant bitlines provided in the memory 2.

FIG. 11 shows the data structure of a preferred embodiment of the memory repair solution calculated by repair unit 6. In the shown embodiment the memory cell array 2 comprises two redundant output/input units 22 and two redundant wordlines for memory cell array 2 having 8 K×32 Bit. In this case the memory repair solution comprises 30 Bits as shown in FIG. 11.

The memory repair solution comprises four data fields. In the first data field the number of a first input/output unit 19 to be replaced is indicated. A corresponding flag indicates whether the data field contains a valid value.

In a second data field a number of a further input/output unit to be replaced is memorized and a corresponding data flag indicates whether the second data field contains a valid value.

In the third data field a number of a first word line to be replaced is stored and a corresponding flag indicates whether the data field contains a valid value.

The fourth data field also memorizes a number of a wordline to be replaced and a corresponding indication flag is provided.

In the given example the number of input/output units is represented by a four bit data value. The number of wordlines to be replaced is represented by a nine bit data value. Accordingly the memory repair solution comprises 30 bits, i.e. 4 flag bits and 2×4 bits for input/output units to be replaced and 2×9 data bits for two redundant word lines to be exchanged. The . . . repair solution as shown in FIG. 12. is calculated by the repair unit 6 and applied to the fuse blowing interface 7 according to the present invention via data lines 17.

Figure 12:
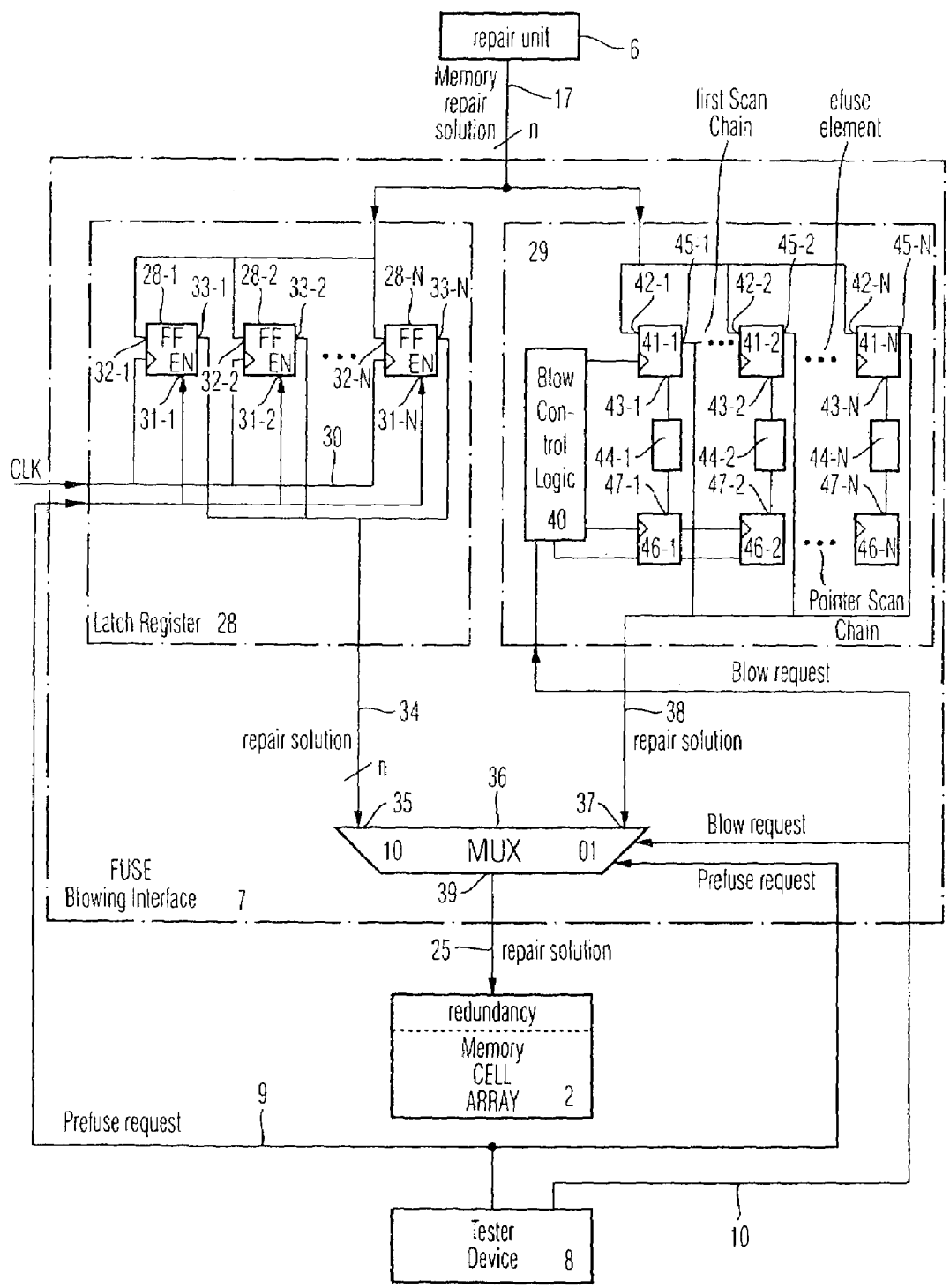
FIG. 12 shows a preferred embodiment of the blowing interface according to the present invention.

FIG. 12 shows a preferred embodiment of the fuse blowing interface 7 according to the present invention. The fuse blowing interface 7 is connected to the repair unit 6 via data lines 17 comprising for instance 30 data lines for each data bit of the memory repair solution as shown in FIG. 11. The fuse blowing interface 7 according to the present invention comprises a latch register 28 and a fuse blowing unit 29. The latch register 28 is provided for latching the calculated memory repair solution when a prefuse signal is applied to the fuse blowing interface 7 via control line 9 from the external test device 8. The latch register 28 comprises several flip-flop circuits 28-1, 28-2, . . . , 28-N which are triggered by a clock signal CLK applied via clock signal line 3. Each flip-flop circuit 28-$i$ comprises an enabling input 33-$i$ connected to the prefuse request control signal line 9. Further each flip-flop circuit 28-$i$ comprises data input 32-$i$ connected to a data line of the data bus 17. In this manner to each flip-flop 28-$i$ of the latch register 28 one data bit of the calculated memory repair solution is applied. The number of flip-flops 28-$i$ within the latch register 28 corresponds to the word width of the memory repair solution as shown in FIG. 11. In the given example the latch register 28 comprises 30 latch flip-flops. Each flip-flop 28-$i$ has a data output 33-$i$ connected via data lines 34-$i$ of a data bus 34 to first terminals 35 of a multiplexer 36 within in the fuse blowing interface 7. The multiplexer 36 comprises second terminals 37 connected to the fuse blowing unit 29 via data lines 38. Further the multiplexer 36 comprises output terminals 39 which are connected to the memory cell array 2 through repair data lines 25. In the shown embodiment the number of data lines of the data bus 34, of the data bus 38 and of data bus 25 is 30 corresponding to the word width of the memory repair solution. The fuse blowing unit 29 comprises a blow control logic 40 which is connected to the external tester device 8 via control line 10. The fuse blowing unit 29 further comprises a first scan chain 41 of clock triggered flip-flops 41-$i$. Each flip-flop of the scan chain 41 comprises a first data input 42 for receiving a data bit of the memory repair solution 17. Further each flip-flop of the scan chain 41 has a second input/output 43-$i$ connected to a corresponding electrical fuse 44-$i$. The flip-flops 41-$i$ comprises data outputs 45-$i$ each connected to a data line of the data bus 38 and connected to a terminal 37-$i$ of the multiplexer 36. The blow control logic 40 is connected to a pointer scan chain 46 having N flip-flops 46-$i$. The output 47-$i$ of a flip-flop 46-$i$ is connected to an electrical fuse 44-$i$. When the blow control logic 40 receives a blow request signal from the external tester device 8 it blows the electrical fuses 44-$i$ sequentially according to the bit data pattern of the applied memory repair solution latched by the flip-flop chain 41. In each clock cycle of the clock signal one electrical fuse 44-$i$ is activated by the corresponding pointer scan flip-flop 46-$i$ and blown or not blown according to the data bit memorized by the corresponding flip-flop 41-$i$. In the first clock cycle the first scan chain flip-flop 46-1 activates the electrical fuse 44-1 which is blown in case that flip-flop 41-1 indicates a high data bit value of the data bit of the memory repair solution applied via corresponding data line 17-$i$. The blowing of the electrical fuses is performed by applying a high data voltage leading to an overcurrent. In the next step the scan chain flip-flop 46-2 activates the next electrical fuse 44-2 which is blown in case that the corresponding data bit of the memory repair solution is logically high. The blowing process is performed until the last electrical fuse 44-N is reached. In the embodiment the memory repair solution as shown in FIG. 11 having a word width of 30 bit the blowing process asks 30 clock cycles. By sequentially blowing electrical fuses 44-$i$ it is possible to perform the blowing without increasing a power supply for the fuse blowing unit 29. The blowing of the fuses can be performed with a closed chip package.

Figure 2:
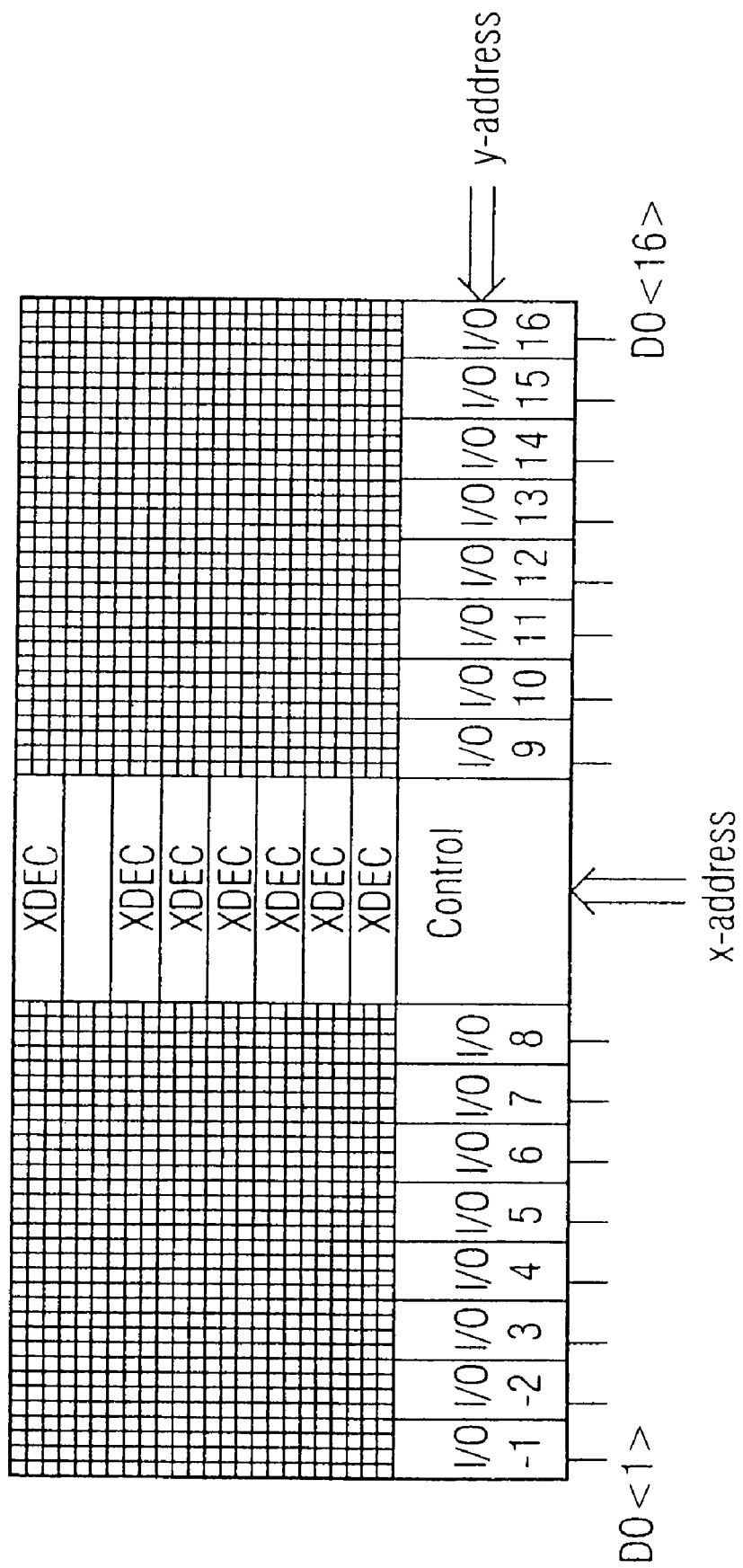
FIG. 2 shows the main memory within a memory chip according to the state of the art.
Figure 3:
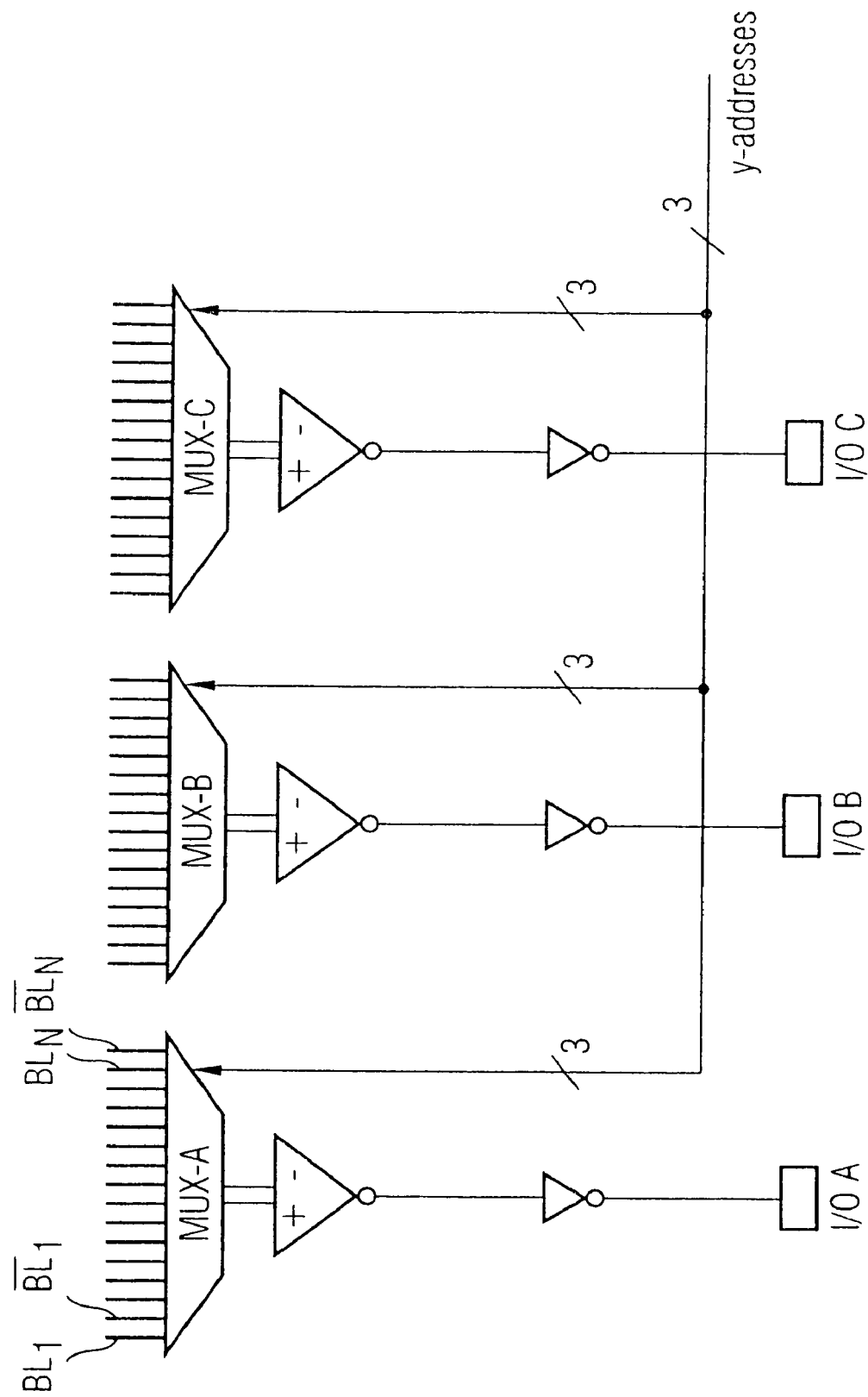
FIG. 3 shows an input/output unit according to the state of the art.

The fuse blowing interface 7 as shown in FIG. 2 can be switched between two modes. In a first mode the calculated memory repair solution 17 is latched by the latch register 28 and applied to the memory cell array 2 by switching input terminals 35 to output terminals 39 of the multiplexer 36. In this manner it can be tested whether the calculated memory repair solution 17 really repairs the memory cell array 2 before a permanent blowing of the fuses 44 is performed. After it has been decided that the memory repair solution 17 calculated by the repair unit 6 and latched by the register 28 leads to a repaired memory cell array the found memory repair solution is stored permanently by blowing the fuses 44 within the fuse blowing unit 29. To this end the tester device 8 applies a blow request signal to the blow control logic 40 which blows sequentially the fuses 44-1 to 44-N according to the applied data bit pattern representing the memory repair solution.

The automatic test diagnose repair with self controlled electrical fuse blowing according to the present invention performed by the fuse blowing interface 7 has the advantages that the computations to calculate the fuses 44 to be blown are performed by the built in self test-unit 3 and not by the external tester device 8. Consequently an extensive data exchange between the external tester device 8 and the memory chip 1 by using predetermined data protocol can be avoided thus saving time to repair the memory chip and reducing production costs.

. . .

1 memory chip
2 memory cell array
3 built in self test-unit
4 test-unit
5 diagnose unit
6 repair unit
7 fuse blowing interface
8 external tester device
9 control line
10 control line
11 control line
12 control line
13 control line
14 control line
15 data lines
16 data lines
17 data lines
18 X-address decoder
19 input/output unit
20 data pads
21 redundant x-address decoders
22 redundant input/output units
23 control and comparator unit
24 address bus
25 repair solution data line
27 multiplexer stage
28 latch register
29 fuse blowing unit
30 clock signal line
31 enabling input
32 flip-flop input
33 flip-flop output
34 data bus
35 multiplexer input terminals
36 multiplexer
37 multiplexer input terminals
38 data bus
39 multiplexer output terminals
40 blow control logic
41 scan chain flip-flops
42 flip-flop inputs
43 flip-flop terminals
44 electrical fuses
45 flip-flop outputs
46 scan flip-flops

The invention claimed is:

1. A fuse blowing interface for a memory chip comprising:

(a) a latch register operable to latch a calculated memory repair solution when a prefuse request signal is received from an external tester device; and (b) a fuse blowing unit comprising a plurality of electrical fuses, the fuse blowing unit operable to blow a set of said fuses according to the calculated memory repair solution when a blow request signal is received from the external tester device.

2. The fuse blowing interface according to claim 1, further comprising a multiplexer operable to provide an output of the latch register to a memory cell array of the memory chip responsive to the prefuse request signal and is operable to provide an output of the fuse blowing unit to the memory cell array after the blow request signal has been received.

3. The fuse blowing interface according to claim 1 wherein the latch register comprises clock triggered flip-flop circuits for latching the memory repair solution received from a repair unit.

4. The fuse blowing interface according to claim 3 wherein each flip-flop circuit has an enabling input operably connected to the external tester device to receive the prefuse request signal via a control line.

5. The fuse blowing interface according to claim 3 wherein the clock triggered flip-flop circuits of the latch register are connected in parallel.

6. The fuse blowing interface according to claim 5 wherein the number of flip-flop circuits of the latch register corresponds to a word width of the calculated memory repair solution.

7. The fuse blowing interface according to claim 3 wherein each flip-flop circuit of the latch register has an output connected to first input terminals of the multiplexer.

8. The fuse blowing interface according to claim 1 wherein the fuse blowing unit further comprises a clocked blow control logic element which blows a group of electrical fuses according to the memory repair solution calculated by a repair unit when the blow request signal is applied from the external tester device via a control line.

9. The fuse blowing interface according to claim 8 wherein the electrical fuses are connected in parallel.

10. The fuse blowing interface according to claim 9 wherein the number of parallel connected electric fuses corresponds to a word width of the calculated memory repair solution.

11. The fuse blowing interface according to claim 8 wherein the blow control logic element is further operable to blow the electrical fuses by applying an overcurrent.

12. The fuse blowing interface according to claim 8 wherein the blow control logic element is further operable to blow the electrical fuses according to the memory repair solution sequentially.

13. The fuse blowing interface according to claim 12 wherein the blow control logic element is further operable to blow one electrical fuse in each clock cycle of the clock signal.

14. The fuse blowing interface according to claim 1 wherein the memory repair solution comprises numbers of input/output units of the memory cell array which are to be replaced by a redundant input/output units and numbers of wordlines of the memory cell array which are to be replaced by redundant wordlines connected to corresponding redundant x-address decoders.

15. A memory chip with self-controlled fuse blowing comprising:

(a) a memory cell array comprising a plurality of memory cells having addressable wordlines and bitlines, said memory cell array further comprising redundant memory cells for repairing faulty memory cells;

(b) a built-in self test unit comprising:
- (b1) a test unit operable to detect faulty memory cells in the memory cell array,
- (b2) a diagnose unit operable to store errors detected in the memory cell array,
- (b3) a repair unit operable to calculate a memory cell
- (b4) a fuse blowing interface including
    - a latch register operable to latch the calculated memory repair solution responsive to a prefuse request signal received from an external tester device, and
    - a fuse blowing unit including a plurality of electrical fuses, the fuse blowing unit operable to blow select ones of the plurality of electrical fuses according to the calculated memory repair solution responsive to a blow request signal received from the external tester device.

16. The memory chip of claim 15, wherein the fuse blowing interface further includes a multiplexer configured to provide an output of the latch register to the memory cell array in a first mode corresponding to the receipt of the prefuse request signal and further configured to provide an output of the fuse blowing unit to the memory cell array in a second mode corresponding to the receipt of the blow request signal.

17. The memory chip of claim 15, wherein the latch register comprises clock triggered flip-flop circuits for latching the memory repair solution received from a repair unit.

18. The memory chip of claim 17, wherein each flip-flop circuit has an enabling input operably connected to the external tester device to receive the preface request signal via a control line.

19. The memory chip of claim 17, wherein the clock triggered flip-flop circuits of the latch register are connected in parallel.

20. The memory chip of claim 19, wherein the number of flip-flop circuits of the latch register corresponds to a word width of the calculated memory repair solution.

* * * * *